United States Patent [19]

Chapman

[11] Patent Number: 5,227,649
[45] Date of Patent: Jul. 13, 1993

[54] CIRCUIT LAYOUT AND METHOD FOR VLSI CIRCUITS HAVING LOCAL INTERCONNECTS

[75] Inventor: Richard A. Chapman, Dallas, Tex.

[73] Assignee: Texas Instruments Incorporated, Dallas, Tex.

[21] Appl. No.: 850,361

[22] Filed: Mar. 6, 1992

Related U.S. Application Data

[63] Continuation of Ser. No. 711,565, May 30, 1991, abandoned, which is a continuation of Ser. No. 560,469, Jul. 25, 1990, abandoned, which is a continuation of Ser. No. 315,958, Feb. 27, 1989, abandoned.

[51] Int. Cl.⁵ .................. H01L 21/283; H01L 27/10; H01L 29/78
[52] U.S. Cl. ..................................... 257/204; 257/206; 257/69; 257/351; 257/390
[58] Field of Search ............... 357/42, 71, 59; 437/48, 437/192; 257/204, 206, 69, 351, 390

[56] References Cited

U.S. PATENT DOCUMENTS

| | | | |
|---|---|---|---|
| 4,209,716 | 6/1980 | Raymond, Jr. | 357/23.9 |
| 4,246,593 | 1/1981 | Bartlett | 357/23.9 |
| 4,300,212 | 11/1981 | Simko | 357/23.5 |
| 4,408,385 | 10/1983 | Mohar Rao et al. | 357/23.9 |
| 4,432,007 | 2/1984 | Cady | 357/71 R |
| 4,507,853 | 4/1985 | McDavid | 357/71 |
| 4,520,554 | 6/1985 | Fisher | 357/71 R |
| 4,675,715 | 6/1987 | Lepselter et al. | 357/59 A |
| 4,710,897 | 12/1987 | Masuoka et al. | 357/59 |
| 4,731,341 | 3/1988 | Kawakatsu | 357/71 |
| 4,766,476 | 8/1988 | Schallenberger et al. | 357/42 |
| 4,785,341 | 11/1988 | Ning et al. | 357/59 I |
| 4,794,561 | 12/1988 | Hsu | 357/23.4 |
| 4,804,636 | 2/1989 | Groover, III et al. | 357/42 |
| 4,805,148 | 2/1989 | Diehl-Nagle et al. | 357/23.6 |
| 4,814,841 | 3/1989 | Masuoka et al. | 357/42 |
| 4,821,085 | 4/1989 | Haken et al. | 357/42 |
| 4,910,566 | 3/1990 | Ema | 357/71 |
| 4,978,637 | 12/1990 | Lion et al. | 357/71 |

Primary Examiner—Eugene R. LaRoche
Assistant Examiner—Viet Q. Nguyen
Attorney, Agent, or Firm—Peter T. Rutkowski; Richard Donaldson; William E. Hiller

[57] ABSTRACT

The invention is an improved layout for integrated circuits employing local interconnect pads, particularly six-transistor SRAM circuits, comprising a local interconnect pad which electrically bridges two segments of a conducting line and an active device, and a method for employing the layout.

2 Claims, 5 Drawing Sheets

CIRCUIT LAYOUT AND METHOD FOR VLSI CIRCUITS HAVING LOCAL INTERCONNECTS

This application is a continuation of application Ser. No. 07/711,565 filed May 30, 1991, abandoned, which is a continuation of Ser. No. 07/560,469 filed Jul. 25, 1990, abandoned, which is a continuation of Ser. No. 07/315,958 filed Feb. 27, 1989, abandoned.

BACKGROUND OF THE INVENTION

The invention relates to improved layout design of high density integrated circuits, particularly circuits having a large number of circuit devices per cell such as six-transistor static random access memory devices and especially such circuits employing local interconnect pads.

In the field of VLSI integrated circuit design, a critical factor is, of course, density of cells and devices per unit area on the circuit. Complementary metal oxide semiconductor (CMOS) memory devices typically have one million or more memory cells per device with associated circuitry. Static random access memory (SRAM) devices are a popular type of memory device at this time due to their fast access time and ability to retain data for extended periods of time without refresh compared to dynamic random access memory devices. CMOS SRAM devices have six transistors per memory cell. Therefore, the individual cell size is even more critical in the design of these devices than in the design of devices having fewer elements per cell. A great deal of attention is therefore given to the circuit layout of the six-transistor SRAM.

A six-transistor SRAM cell, as is known in the art is shown in FIG. 1 which will now be briefly described. FIG. 1 illustrates a SRAM cell which, as known, can be incorporated into a CMOS or BiCMOS SRAM device. The cell is configured having cross coupled inverters consisting of p-channel transistor 6 and n-channel transistor 4 having their source-to-drain paths connected in series between $V_{cc}$ and ground and having their gates tied together and P-channel transistor 5 and n-channel transistor 3 connected in the same manner. Cross coupling is accomplished by the gates of transistors 4 and 6 being connected to the drains of transistors 3 and 5 and the gates of transistors 3 and 5 being connected to the drains of transistors 4 and 6. N-channel pass transistors 1 and 2 are connected at their gates to word line 7. Pass transistor is connected in its source-to-drain path between first bit line 9 and node 10. Pass transistor 2 is connected in its source-to-drain path between a second bit line 8 and node 11. The operation of the cell as is well known in the art forms no part of the invention and will not be further detailed here. For a detailed discussion of this operation, one is referred to U.S. patent application Ser. No. 156,520; assigned to the assignee of this application, the issue fee on this case was paid on May 1, 1989, assigned to the assignee of this invention (TI-13235).

Further refinement to the above described CMOS SRAM cell has been described in the literature and is the subject of copending U.S. patent application Ser. No. 837,478, assigned to the assignee of this application, having a common assignee with the instant application. This refinement relates to an improved cell layout of the six-transistor SRAM cell using local interconnect pads comprising TiN or similar materials to form interconnections bridging transistor source/drain regions to polysilicon (or other conductive material) conducting lines which form the gates of the transistors and form conducting lines between transistors in the cell. The use of local interconnect pads has increased the density of the cells in a device and reduced parasitic capacitance over cells using such interconnect means as metal jumpers. A typical cell configuration layout as used in SRAM fabrication using local interconnect pads as is known is illustrated in FIG. 2. The same reference numerals as used in FIG. 1 are used to indicate like elements. The cell configuration of FIG. 2 omits some elements such as via windows, metal lines, and other structural elements not necessary to illustrate the configuration of the prior art cell for the purposes of the explanation of the instant invention. Also, continuation of the cell elements as they interconnect and interface with the neighboring cells of the device are not shown to improve clarity. It will be understood, however, that the cell shown will typically be interconnected with up to one million or more cells of similar configuration in an SRAM device.

Shown in FIG. 2 are two p-moat regions 24 and 25 drawn in diagonal hatching. Overlying p-moat 24 is conducting line 31 which may be polysilicon. Transistor 6 is formed in the p-moat 24 having the overlying conducting line 31 as the gate. Conducting line 32 overlies p-moat 25. Likewise, transistor 5 is formed in p-moat 25 having conducting line 32 forming its gate where it overlies the p-moat. Conducting line 32 may also be polysilicon. Between conducting lines 31 and 32 and respective moats 24 and 25 is a gate dielectric (not shown) as is well known in the art. Local interconnect pads 30 and 26 shown in bold outline overlie and connect a source/drain region of transistor 6 with conducting line 32 and a source/drain region of transistor 5 with conducting line 31, respectively. Similarly, transistors 4 and 3 are formed in n-moat 23 and n-moat 21, respectively, having conducting line 31 as the gate of transistor 4 and conducting line 32 as the gate of transistor 3. Again, a gate dielectric (not shown) separates the gates from the moat region. Local interconnect pad 27 overlies and connects a source/drain region of transistor 4 with conducting line 32 and local interconnect pad 28 overlies and connects a source/drain region of transistor 3 and conducting line 31. Pass transistor 1 is formed from the same n-moat region 21 as transistor 3 and having as its gate overlying word line 7 which may be polycrystalline silicon. Conducting line 31 and 32 and word line 7 are shown in random dot pattern for clarity. N-moats 21, 22, and 23 are shown in horizontal and vertical crosshatching. Different crosshatching patterns are used for the purpose of clarity and are not intended to designate specific materials or conductivity as in convention. Finally, pass transistor 2 is formed in n-moat 22 with overlying word line 7 as its gate. Local interconnect pad 29 overlies and connects a source/drain region of transistor 2 and conducting line 32. N-moat 22 and n-moat 21 connect by means not shown to a first and second bit line (not shown).

As shown in FIG. 2, the resulting six-transistor SRAM cell occupies a generally rectangular area having a major axis which is considerably longer than the minor axis thereof. Although FIG. 2 is not intended to be drawn to scale, it approximates the shape of the cell as it is actually fabricated in an SRAM device. Design rules and other design considerations of the cell in practice have resulted in a cell which occupies a rectangle having relatively long and narrow dimensions.

Some of the design rules which must be considered when designing a six-transistor SRAM cell utilizing local interconnect pads, and, in fact in the design of other type memory cells and other devices will be explained with reference to FIG. 3a. A moat 34 underlies a conducting line 31. These two elements are generally separated by a dielectric (not shown). A transistor may be formed from these elements. Conducting line 32 is located outside of moat 34. Local interconnect pad overlies and connects moat region 34 and conducting line 32. As is well known, design rules must be formulated and applied to any integrated circuit design configuration or process. These rules specify minimum (or maximum) distances for reliability and operation of the device. The rules are dependent upon many factors such as the variability in dimensions of the structures fabricated and the variability in alignment of one structural material to another. Both variabilities depend in turn on fabrication techniques applied and tolerances of the equipment used in fabrication. Illustrated in FIG. 3a are five minimum design rules which together dictate the minimum width that the configuration shown may be fabricated. Distance "a" is the minimum line width for a polysilicon conducting line for a given device and fabrication process. A minimum distance "a" may be, for example, 0.8 μm. Note that the distances specified herein for design rules are exemplary only and would vary for different configurations and design processes. Distance "b" is the distance required between two conducting lines. A typical minimum distance "b" may be 1.0 μm. Distance "c" represents the minimum allowed distance between a local interconnect pad and an unrelated conducting line. This distance may be, for example, 0.7 μm. Distance "d" is the distance that the local interconnect pad overlaps the moat region. A typical minimum design rule for distance "d" is 0.8 μm, e.g. Distance "e" is the distance that the local interconnect pad overlaps the conducting line. A typical design rule minimum for distance "e" may be 0.6 μm. As can be seen then, the minimum width for this configuration from one conducting line to the other, including the width of both lines, must be at least a+c+d+e+(a−e). For the exemplary design rule distances given above this would result in a minimum distance of 3.1 μm. Additionally, it can be seen that the alignment of the local interconnect pad over the conducting line is critical to achieve minimum distance "e" while not extending over the conducting line to thereby increase the width.

SUMMARY OF THE INVENTION

Therefore, it is an object of this invention to reduce the area required to fabricate a six-transistor SRAM.

It is a further object of this invention to improve the tolerance of the conventional six-transistor SRAM layout to fabrication inaccuracies, especially to local interconnect pad misalignment.

It is a further object of the invention to provide a layout design improvement for a local interconnect pad connection to a conducting line in circuits generally whereby at least one dimension of the circuit layout off (footprint) may be reduced.

These and other objects of the invention have been accomplished by providing an improved layout design for connection of local interconnect pads to conducting lines, especially in the layout of a conventional six-transistor SRAM cell. The improved layout includes splitting a conducting line to provide a gap in this line at the area of conventional overlap and use of an extended local interconnect pad to overlap, connect, and bridge the conducting lines at both of the ends formed by the gap. By this technique and layout, the conducting line may be advantageously moved closer to other elements of the circuit because the design rule for minimum overlap of the local interconnect over the conducting line (distance "e" in the above example) may be applied in a direction perpendicular to the direction that the design rule for minimum overlap of local interconnect pads to other circuit elements is applied (distance "d" in the above example).

Further description and explanation of the invention will be made with reference to ones of the drawing figures, a brief description of which follows.

BRIEF DESCRIPTION OF THE DRAWING FIGURES

Figure 3A:
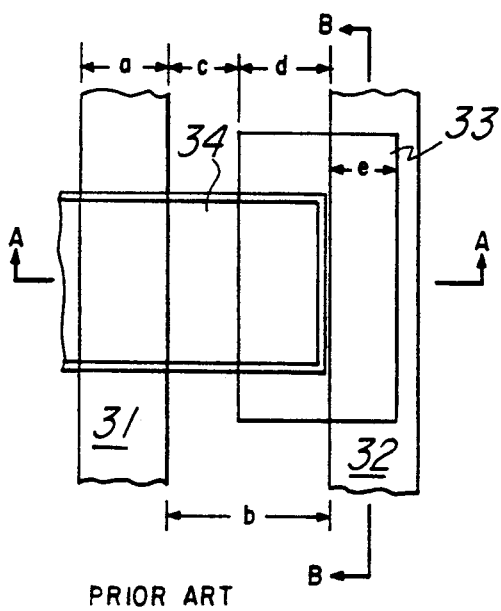
Figure 3B:
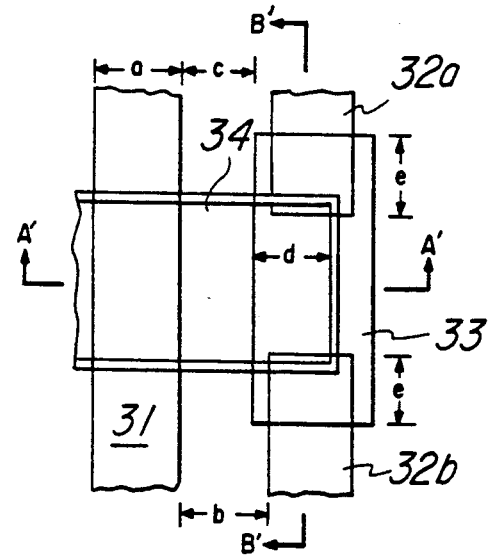
Figure 3C:
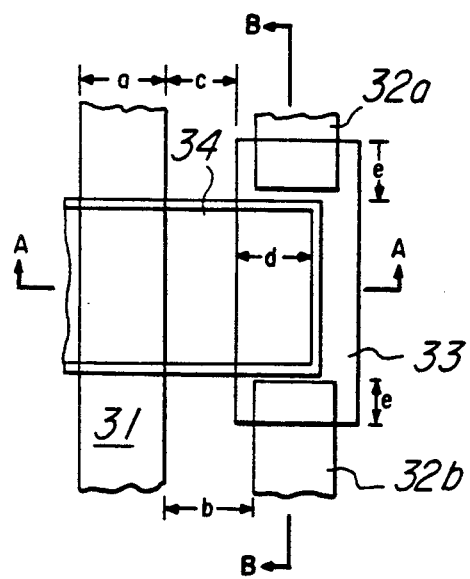

FIGS. 3a, 3b, and 3c are plan views of a local interconnect layout according to a conventional prior art layout, a first embodiment layout, and a second embodiment layout, respectively.

Figure 4A:
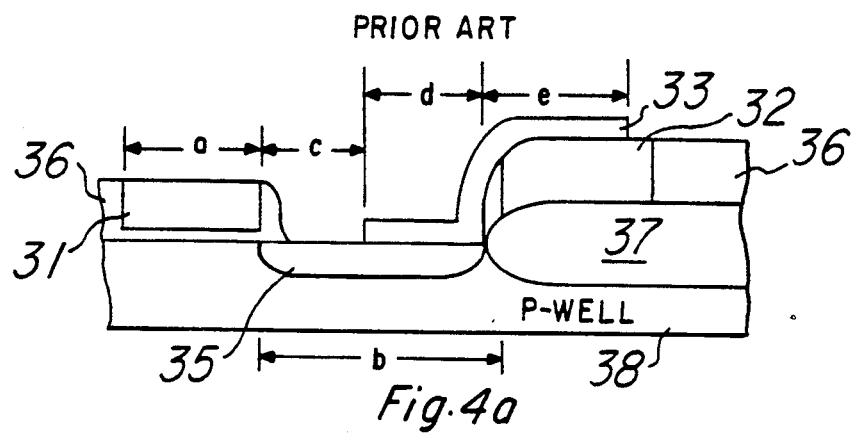

FIG. 4a is a cross-sectional view of the layout of FIG. 3a along sectional line AA.

Figure 4B:
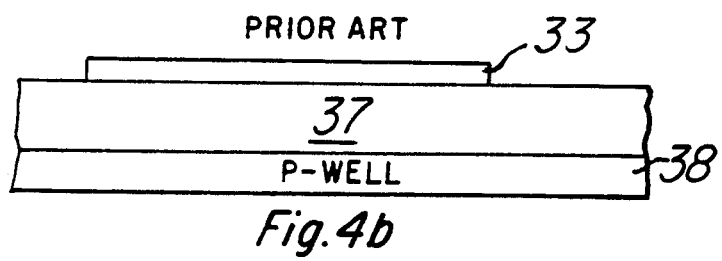

FIG. 4b is a cross-sectional view of the layout of FIG. 3a, taken along sectional line BB.

Figure 4C:
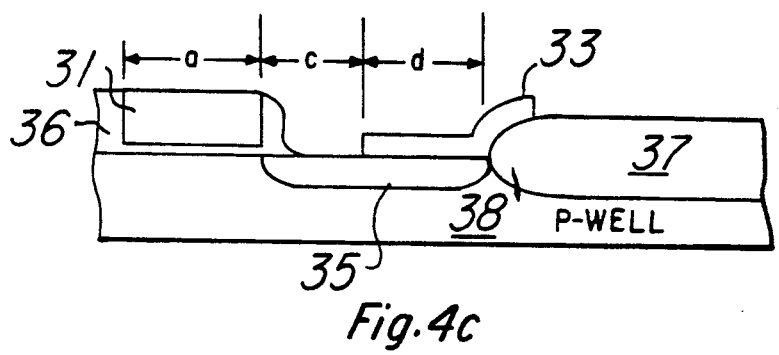

FIG. 4c is a cross-sectional view of the layout of FIG. 3b, taken along sectional line A'A'.

Figure 4D:
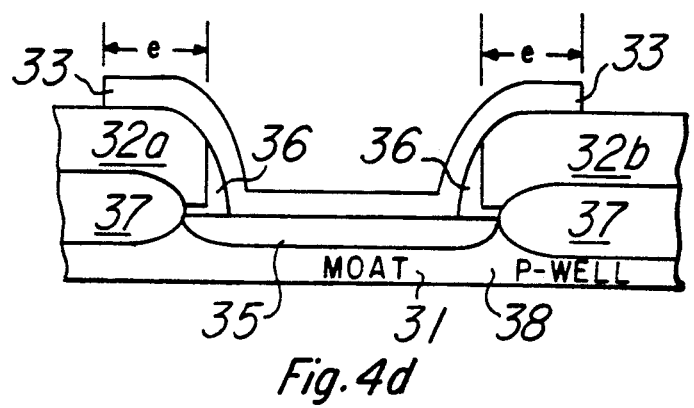

FIG. 4d is a cross-sectional view of the layout of FIG. 3b, taken along sectional line B'B'.

Figure 5:
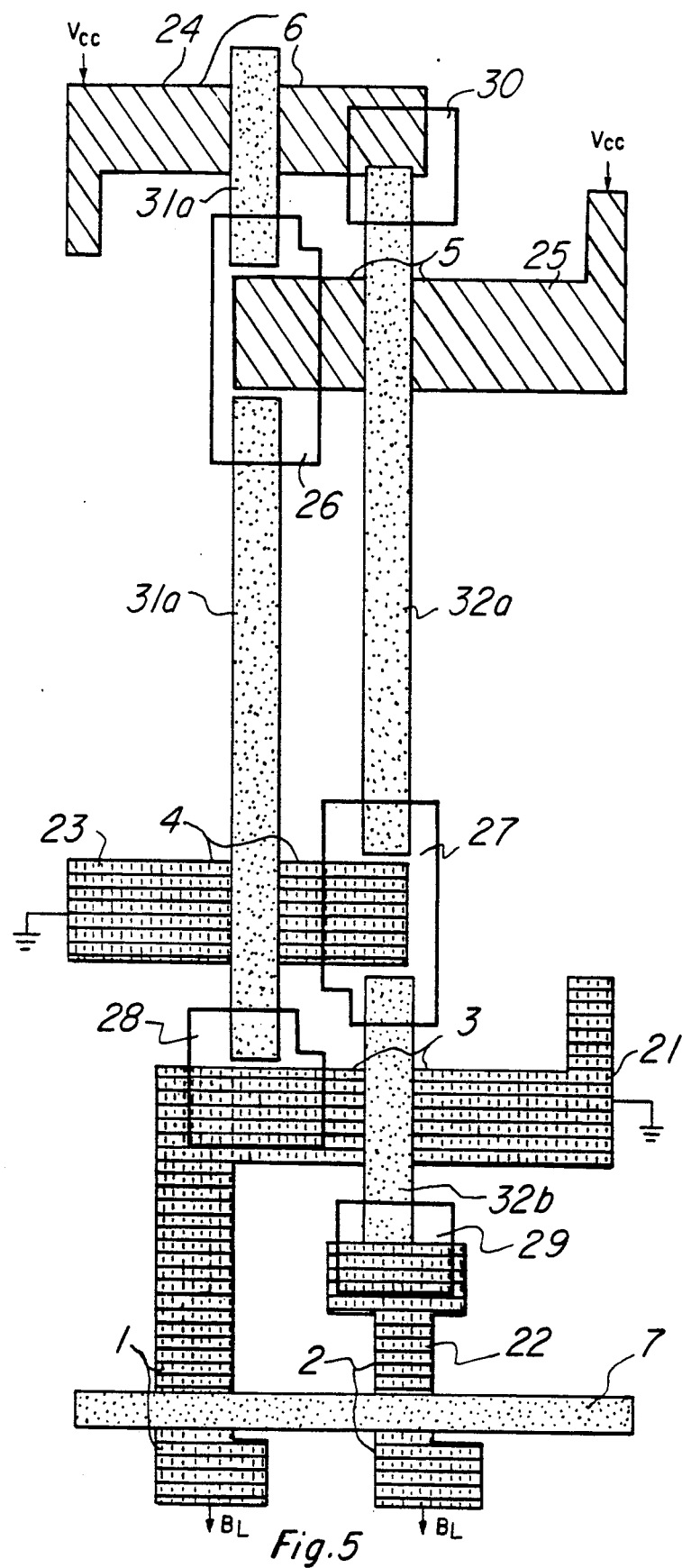

FIG. 5 is a plan view of a six-transistor SRAM cell embodying the instant invention.

DESCRIPTION OF THE INVENTION

In contemplating the conventional six-transistor SRAM cell of the prior art as described above, the Inventor has observed that the minimum area of the footprint of the cell may be reduced most effectively by reducing the width dimension of the footprint, owing to the long rectangular configuration of the conventional layout. The Inventor has further observed that the width dimension of the footprint of the conventional layout is principally dependent upon the design rules which are applied along the width direction to the distance between conducting lines at the local interconnect pad juncture in the conventional layout of the SRAM cell. The Inventor has still further observed that one of the most critical alignment tolerances in the fabrication of the conventional device is the alignment of the local interconnect pad over the conducting line which the pad electrically connects. The Inventor has discovered a novel and unobvious layout design for local interconnect connection to a conducting line, particularly applicable to a six-transistor SRAM cell and generally applicable to circuits employing local interconnect pads.

A first embodiment of the invention will now be described with reference to FIG. 3b. The reference numbers of FIG. 3a are continued in FIGS. 3b and 3c to refer to like elements in the inventive embodiments. FIG. 3b illustrates the same section of a device as illustrated in FIG. 3a. Element 34 is a moat region. Overlying the moat region 34 is a conducting line 31, which may be polysilicon and may form a gate of a transistor formed in the moat 34. Conducting line 32, as shown, is made discontinuous at the location of the conventional connection to form a gap or discontinuity therein which is bridged by extension of local interconnect pad 33 to overlie the resulting connection line segments 32a and 32b at least by a distance "e", the minimum design rule overlap of a local interconnect pad over a conducting line. It is pointed out that the segments 32a and 32b of the conducting line may extend over the moat region 34 somewhat, as shown, in which case the gate dielectric layer will separate the segments 32a and 32b from the underlying moat 34, or the segments 32a and 32b may end coincidental with the edge of the moat region 34. In both cases, the local interconnect layer 33 provides the electrical connection between 32a and 32b as well as between 32a and 34 or between 32b and 34.

It is apparent from the drawing figures that the layout of FIG. 3b provides the advantage over that of FIG. 3a in that design rule distance "e" may be applied in a direction perpendicular to the application of design rule distances "a", "b", "c", and "d". This allows the designer to move conducting line segments 32a and 32b closer to conducting line 31 to a minimum distance "b'", the minimum design rule distance between unrelated conducting lines (1.0 um according to the exemplary design rules previously provided) or the minimum design rule for distance "c" if that distance were larger than the distance for "b'". This allows the total width of the segment to be reduced since distance "e" may be applied in a lengthwise direction (vertically in the drawing) and the application of the design rule for distance "c" does not depend on the location of the conducting line 32. Local interconnect pad 33 may extend past the outside edge of conducting line 32 as shown if no design rules interfere with its encroachment upon elements of a neighboring device, or the pad 33 may be designed to end at the outside edge of the line 32 if design rule factors with neighboring devices come into play. It can be seen then that the total area of the footprint of this segment of the device may be reduced by reducing the width of the segment by application of the inventive layout without any addition to the length. Further, the alignment tolerance of the local interconnect to insure minimum overlap of the conducting line is greatly increased.

Further understanding of this embodiment and consideration of the comparative application of design rules to the embodiment is provided by the discussion of sectional drawings of FIGS. 4a-4d to follow.

FIG. 4a is a sectional view of the prior art segment of FIG. 3a taken along the sectional line AA. Moat region 34 and field oxide region 37 are formed over the p-well 38. The Figure shows an active device region 35 shown as an n+ implanted region implanted in the moat. The conductivity types are merely shown as examples. Conducting line 31 which acts as a gate is separated from the moat by a dielectric region 36 which may include a gate oxide underneath 31 and sidewall dielectric filaments on the side of 31 as is depicted. Conducting line 32 lies on field oxide region 37 at approximately the boundary between the field oxide and the moat region. Sidewall dielectric filaments 36 are also shown on the conducting line 32. Local interconnect pad 33 overlies n+ implanted region 35 and conducting line 32. Design rule distances a, b, c, d, and e are clearly shown, requiring a minimum distance from edge to edge of the conducting lines 31 and 32 of a+c+d+e+(a−e). FIG. 4b is a sectional view of the prior art segment of FIG. 3a taken along sectional line BB. This view merely depicts the conducting line 32 overlying field oxide region 37 which is overlying a p-well, for example. Local interconnect pad 33 overlies and contacts conducting line 32 as shown. No design rule distance is effective in this view.

FIG. 4c is a sectional view showing the segment of the device of the invention taken along sectional line A'A'. The figure shows conducting line 31, dielectric region 36, moat region 31, active device region 35, and field oxide region 37 all having the same locations and relative positions as in FIG. 4a. Local interconnect pad 33 is again a distance "c" from line 31 and overlies moat region 31 a distance "d". However, the local interconnect pad 33 is not required to extend onto field oxide region 37. The minimum required distance from edge to edge from conducting line 31 to conducting line 32 is only a+c+d. As depicted in FIG. 4d, which is a sectional view of the segment of FIG. 3b taken along sectional line B'B', distance "e" is applied in this view along a direction perpendicular to the direction along which the other design rule distances have been applied. FIG. 4d shows field oxide regions 37 defining a moat region 31. Lying above the field oxide regions 37 are conducting line segments 32a and 32b. The conducting line segments 32a and 32b partially overlap the p-well 38 and are separated from the p-well by the dielectric 36 which includes gate oxide and sidewall oxide. Local interconnect pad 33 overlies and bridges conducting line segments 32a and 32b. Distance "d" then may be applied in the direction shown to both segments without increasing the width of the device.

A second embodiment of the invention is depicted in FIG. 3c in which like reference numerals refer to like elements as depicted in FIGS. 3a and 3b. In FIG. 3c, conducting line 31 and moat 34 have the same configuration as shown in FIG. 3b. The difference in this embodiment is that the conducting line segments 32a and 32b do not extend into the moat 34. Local interconnect pad 33 overlaps moat 34 at least a distance "d" and overlaps conducting lines 32a and 32b at least a distance "e". Local interconnect pad 34 then may be required to have a longer dimension in the direction parallel to the major axis of the conducting lines. However, this requirement is not a negative factor to the device operation or fabrication.

The improved layout according to the invention as applied specifically to a six-transistor SRAM of the type shown in FIG. 2 will now be explained with reference to FIG. 5.

Figure 1:
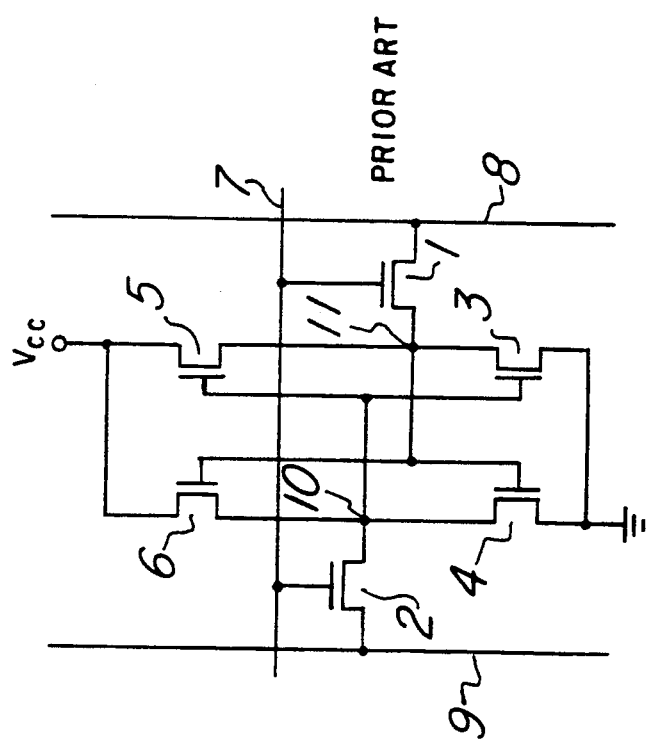
FIG. 1 is a schematic drawing of the conventional six-transistor SRAM cell circuit.
Figure 2:
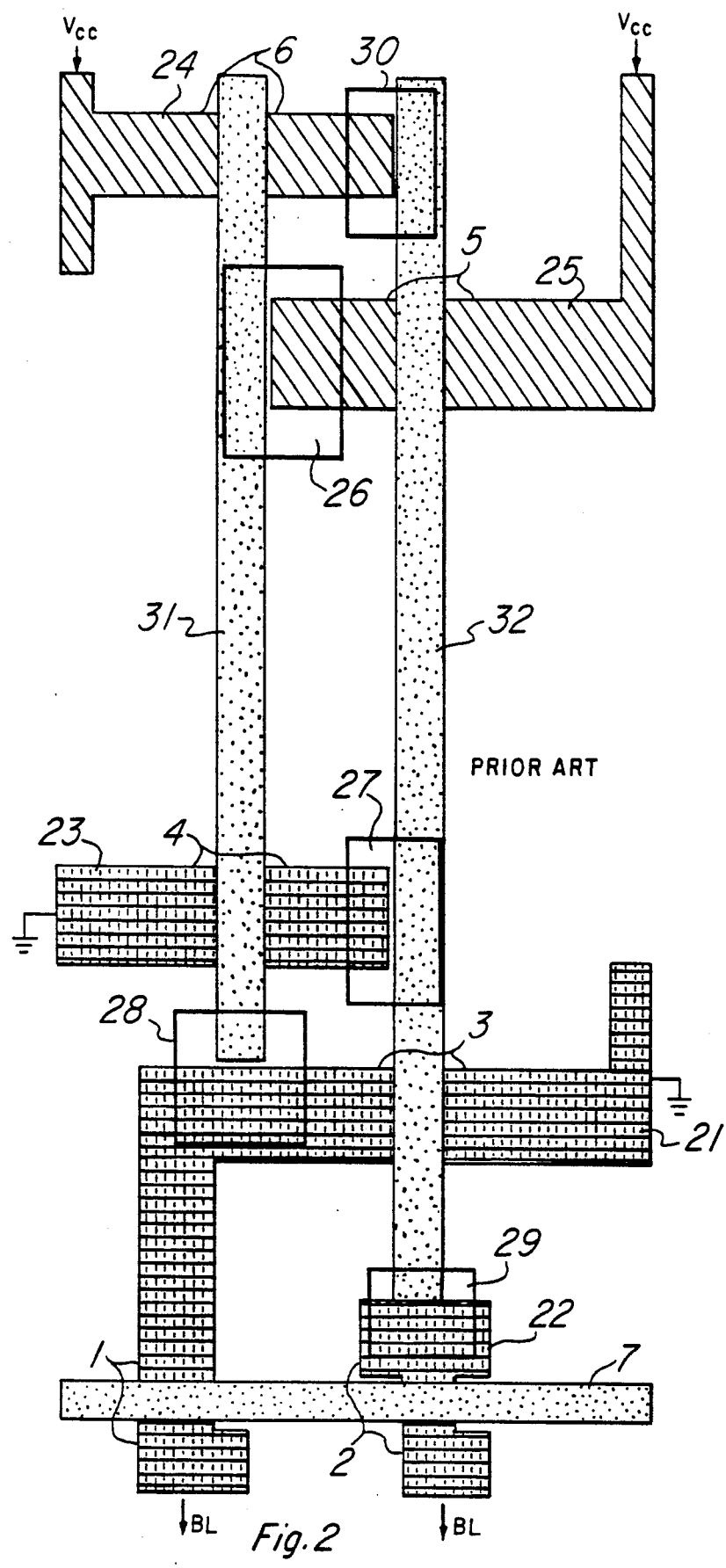
FIG. 2 is a plan view of a conventional layout design of a six-transistor SRAM cell layout having local interconnect pads.

The circuit and layout of FIG. 5 is the same as FIG. 2 except that the improved layout of the invention has been applied to the connections at local interconnect pads 26 and 27. Reference numbers for like elements are carried forward from FIG. 2. Transistor 6 is formed in p-moat 24 having conducting line 31a as the gate. P-moat 24 is also connected by local interconnect pad 30 to conducting line segment 32a and by means not shown to $V_{cc}$. Transistor 5 is formed in p-moat 25 having conducting line segment 32a as its gate. It is pointed out that at all locations where the conducting line segments cross over a moat region, a gate dielectric region separates the moat from the conducting line. The source drain region of transistor 5 underlies and is in contact with local interconnect pad 26. At local interconnect pad 26, conducting line 31 has been made discontinuous, as by a patterned etch technique, to form conducting line segments 31a and 31b. P-moat 25 is also connected by means not shown to $V_{cc}$. Transistor 4 is formed in n-moat 23 having conducting line segment 31b as its gate. Local interconnect pad 27 overlies and is in contact with a source/drain region of transistor 4 in n-moat 23. In the location of local interconnect pad 27, conducting line 32 is made discontinuous, forming conducting line segments 32a and 32b. Local interconnect pad 27 overlies and contacts both segments of conducting line 32. N-moat 23 is also connected by means not shown to ground potential. Transistor 3 is formed in n-moat 21 having conducting line segment 32b as its gate. N-moat 21 is connected at one end thereof by means not shown to ground potential and, at the opposite side of transistor 3, by local interconnect pad 28 to conducting line segment 31b. Pass transistors 1 and 2 are formed and connected in the same way as explained with reference to FIG. 2.

It will be evident by comparison of FIGS. 2 and 5 that by the application of the improved layout of the instant invention to the local interconnect pad connections at 26 and 27 that the conducting lines 31 and 32 are able to be placed closer together. This is, of course, due to the changed relationship of the application of design rules as fully explained with reference to FIGS. 3a-c and 4a-d. As a result, the width (narrow dimension) of the entire six-transistor cell is able to be reduced, greatly reducing the area required for the cell. It has also been found that the tolerance for misalignment of the local interconnect pads has been increased in this cell.

The cell configuration and layout of FIG. 5 is described as an example of one application of the improved layout technique of the instant invention. The invention may be applied to other types of cells, configurations, and layouts as will be recognized by those skilled in the art, particularly those using local interconnect techniques. Various modifications are contemplated to the invention which will be evident to one skilled in the art and which are embodied in the claims to follow.

What is claimed is:

1. A six transistor static random access memory device formed in a substrate comprising:
   two pass transistors;
   first and second inverters comprising two transistors in each inverter, each inverter having an output terminal including a diffusion formed in said substrate;
   said inverters being cross-coupled;
   first and second conducting lines which act as gates for said transistors of said first and second cross-coupled inverters, respectively, said first and second conducting lines each comprising first and second segments of the same conductivity type, said first segment being separated from said second segment defining a gap therebetween, said output terminal of said first inverter extending into said gap of said second conducting line and said output terminal of said second inverter extending into said gap of said first conducting line;
   a first conductor overlying said first and second segments of said first conducting line and said output terminal of said second inverter, said first conductor providing electrically conductive contact between said first and second segments of said first conducting line and said output terminal of said second inverter; and
   a second conductor overlying said first and second segments of said second conducting line and said output terminal of said first inverter, said second conductor providing electrically conductive contact between said first and second segments of said second conducting line and said output terminal of said first inverter.

2. The device of claim 1 wherein said first and second conductors comprise titanium nitride and said first and second conducting lines comprise polycrystalline silicon.

* * * * *